(12) United States Patent
Yang et al.

(10) Patent No.: US 6,332,989 B1
(45) Date of Patent: Dec. 25, 2001

(54) SLURRY FOR CHEMICAL MECHANICAL POLISHING OF COPPER

(75) Inventors: Kai Yang, Fremont; Steven Avanzino; Christy Mei-Chu Woo, both of Cupertino, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/636,516

(22) Filed: Aug. 10, 2000

Related U.S. Application Data

(62) Division of application No. 09/176,891, filed on Oct. 22, 1998.

(51) Int. Cl.7 ................................................. C09K 13/00
(52) U.S. Cl. .......................... 252/79.1; 252/79.2; 451/36; 106/3
(58) Field of Search ..................... 438/692, 693, 438/687, 633; 252/79.1, 79.5, 79.2, 79.4, 79.3; 103/3; 451/36, 40, 41

(56) References Cited

U.S. PATENT DOCUMENTS

| 4,789,648 | | 12/1988 | Chow et al. . |
| 5,858,813 | * | 1/1999 | Scherber et al. . |
| 5,954,997 | | 9/1999 | Kaufman et al. . |
| 5,960,317 | | 9/1999 | Jeong . |
| 6,001,730 | | 9/1999 | Farkas et al. . |
| 6,117,775 | * | 9/2000 | Kondon et al. . |
| 6,136,711 | * | 10/2000 | Grumbine et al. . |

* cited by examiner

*Primary Examiner*—Caridad Everhart

(57) ABSTRACT

Copper metalization is planarized by CMP employing a slurry which avoids scratching the copper surface and is highly selective to the underlying barrier layer. Embodiments include CMP a copper filled damascene opening using a slurry comprising about 0.2 to about 0.7 wt. % $Al_2O_3$ and about 0.2 to about 2 wt. % oxalic acid to achieve a RMS no greater than about 10 Å.

11 Claims, 3 Drawing Sheets

SLURRY FOR CHEMICAL MECHANICAL POLISHING OF COPPER

This application is a divisional of application Ser. No. 09/176,891 filed Oct. 22, 1998.

TECHNICAL FIELD

The present invention relates to semiconductor devices comprising copper (Cu) or Cu alloy interconnection patterns. The present invention is applicable to manufacturing high speed integrated circuits having submicron design features and high conductivity interconnect structures.

BACKGROUND ART

The escalating requirements for high density and performance associated with ultra large scale integration semiconductor wiring require responsive changes in interconnection technology. Such escalating requirements have been found difficult to satisfy in terms of providing a low RC (resistance capacitance) interconnection pattern, particularly wherein submicron vias, contacts and trenches have high aspect ratios due to miniaturization.

Conventional semiconductor devices typically comprise a semiconductor substrate, normally of monocrystalline silicon, and a plurality of sequentially formed dielectric interlayers and conductive patterns. An integrated circuit is formed containing a plurality of conductive patterns comprising conductive lines separated by interwiring spacings, and a plurality of interconnect lines, such as bus lines, bit lines, word lines and logic interconnect lines. Typically, the conductive patterns on different layers, i.e., upper and lower layers are electrically connected by a conductive plug filling a via opening, while a conductive plug filling a contact opening establishes electrical contact with an active region on a semiconductor substrate, such as a source/drain region. Conductive lines formed in trench openings typically extend substantially horizontal with respect to the semiconductor substrate. Semiconductor "chips" comprising five or more levels of metallization are becoming more prevalent as device geometries shrink to submicron levels.

A conductive plug filling a via opening is typically formed by depositing a dielectric interlayer on a conductive layer comprising at least one conductive pattern, forming an opening through the dielectric interlayer by conventional photolithographic and etching techniques, and filling the opening with a conductive material, such as tungsten (W) or aluminum (Al). Excess conductive material on the surface of the dielectric interlayer can be removed by chemical-mechanical polishing (CMP). One such method is known as damascene and basically involves the formation of an opening in a dielectric layer which is filled in with a metal. Dual damascene techniques involve the formation of an opening comprising a lower contact or via opening section in communication with an upper trench opening section, which opening is filled with a conductive material, typically a metal, to simultaneously form a conductive plug in electrical contact with a conductive line. In copending application Ser. No. 08/320,516 filed in Oct. 11, 1994 now U.S. Pat. No. 5,635,423, issued Jun. 3, 1997, prior art single and dual damascene techniques are disclosed, in addition to several improved dual damascene techniques for simultaneously forming a conductive line in electrical contact with a conductive plug for greater accuracy in forming fine line patterns with minimal interwiring spacings.

High performance microprocessor applications require rapid speed of semiconductor circuitry. The control speed of semiconductor circuitry varies inversely with the resistance and capacitance of the interconnection pattern. As integrated circuits become more complex and feature sizes and spacings become smaller, the integrated circuit speed becomes less dependent upon the transistor itself and more dependent upon the interconnection pattern. Miniaturization demands long interconnects having small contacts and small cross-sections. Thus, the interconnection pattern limits the speed of the integrated circuit. If the interconnection node is routed over a considerable distance, e.g., hundreds of microns or more, as in submicron technologies, the interconnection capacitance limits the circuit node capacitance loading and, hence, the circuit speed. As integration density increases and feature size decreases in accordance with submicron design rules, e.g., a design rule below about $0.18\mu$, the rejection rate due to integrated circuit speed delays severely limits production throughput and significantly increases manufacturing costs.

Cu and Cu alloys have recently received considerable attention as a replacement material for Al in VLSI interconnection metalizations. Cu has a lower resistivity than Al, and has improved electrical properties vis-à-vis W, making Cu a desirable metal for use as a conductive plug as well as conductive wiring.

A conventional approach in attempting to form Cu plugs and wiring comprises the use of damascene structures employing CMP, as in Chow et al., U.S. Pat. No. 4,789,648. However, due to Cu diffusion through the dielectric interlayer, Cu interconnect structures are encapsulated by a diffusion barrier layer. Typical diffusion barrier metals include tantalum (Ta), tantalum nitride (TaN), titanium (Ti), titanium silicide (TiN), titanium tungsten (TiW), tungsten nitride (WN), and silicon nitride ($Si_3N_4$) for encapsulating Cu. The use of such barrier materials to encapsulate Cu is not limited to the interface between Cu and the dielectric interlayer, but includes interfaces with other metals as well.

In CMP Cu and Cu alloy metalizations, a slurry is typically employed containing a relatively large amount of alumina ($Al_2O_3$) e.g. about 2 to about 3 wt. %. However, it was found that the Cu surface undergoes abrasion, i.e. scratching. In addition, conventional slurries for CMP do not exhibit a sufficiently high selectively to the underlying barrier layer and, hence, render it extremely difficult to stop on the underlying barrier layer and achieve a desired degree of ultimate planarization.

Accordingly there exits need for a Cu CMP slurry and for a method of CMP Cu metalization which enables high planarization and exhibits high selectivity to an underlying barrier layer.

DISCLOSURE OF THE INVENTION

An advantage of the present invention is a method of CMP Cu metalization to a smooth surface finish with high selectivity to an underlying barrier layer.

Another advantage of the present invention is slurry for CMP Cu metalization which exhibits high selectivity to the underlying barrier layer.

Additional advantages and other features of the present invention will be set forth in the description which follows and in part will be apparent to those having ordinary skill in the art upon examination of the following or may be learned from the practice of the present invention. The advantages of the present invention may be realized and obtained as particularly pointed out in the appended claims.

According to the present invention, the foregoing and other advantages are achieved in part by a method comprising CMP Cu or a Cu alloy with a slurry containing $Al_2O_3$ and oxalic acid.

Another advantage of the present invention is a slurry for CMP Cu or Cu alloys, the slurry containing alumina and oxalic acid.

Embodiment of the present invention include a CMP slurry for Cu or Cu alloys, which slurry contains about 0.2 to about 0.7 wt. % $Al_2O_3$ and about 0.3 to about 1 wt. % oxalic acid.

Additional advantages of the present invention will become readily apparent to those skilled in this art from the following detailed description, wherein embodiments of the present invention are described simply by way of illustrating the best mode contemplated for carrying out the present invention. As will be realized, the present invention is capable of other and different embodiments, and its several details are capable of modifications in various obvious respects, all without departing from the present invention. Accordingly, the drawings and description are to be regarded as illustrative in nature and not as restrictive.

DESCRIPTION OF THE INVENTION

Figure 1:
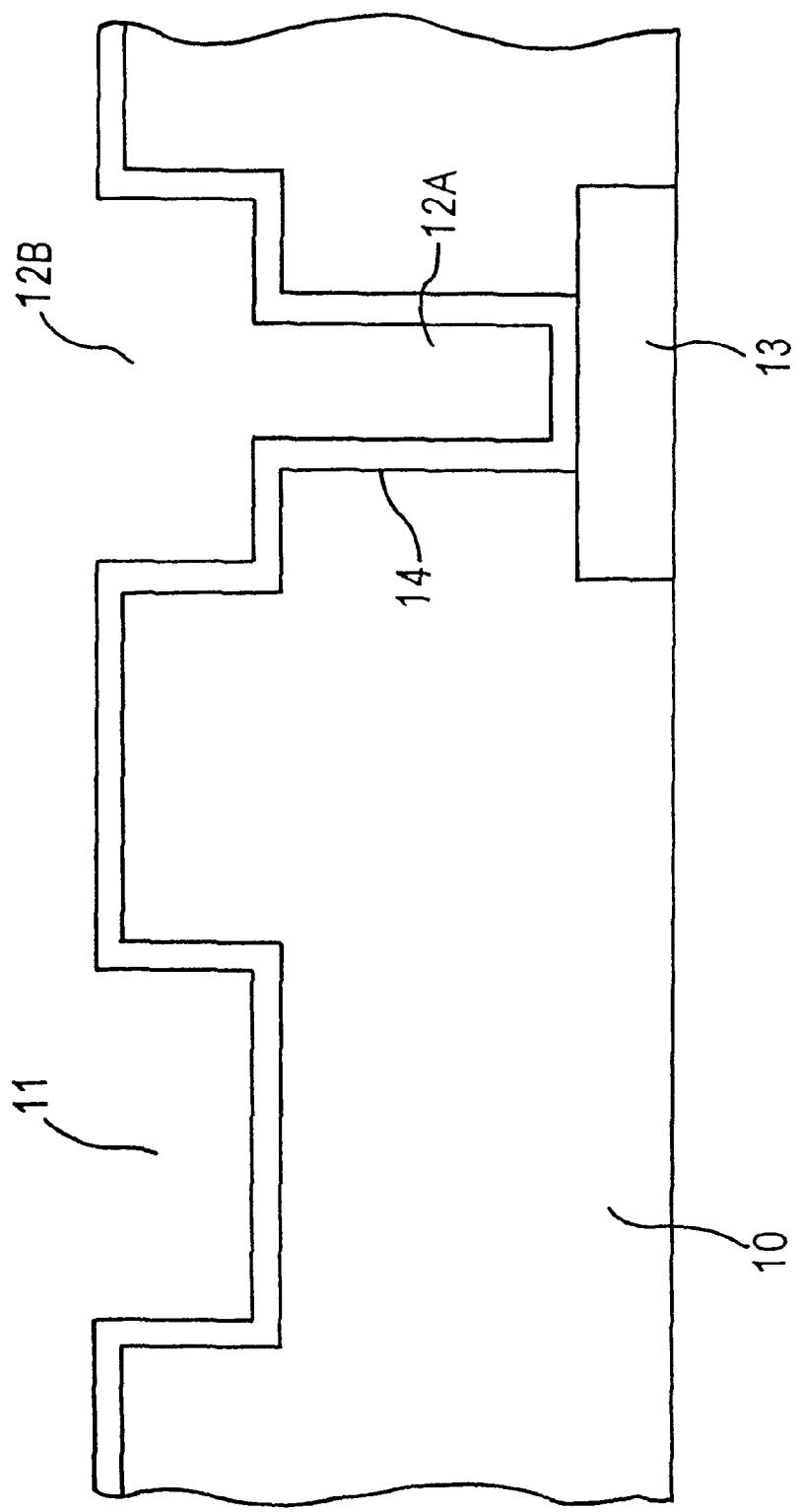
FIGS. 1–3 schematically illustrates sequential phases of a method in accordance with an embodiment of the present invention.

The present invention addresses and solves the problem of achieving a high degree of planarization of Cu and Cu alloy metalization using CMP in a cost effective and efficient manner. In addition, the present invention provides CMP methodology which enables effective polishing of Cu or Cu alloy metalization to achieve a substantially specular surface having a root mean square (RMS) of no greater than about 10 Å while selectively stopping on an underlying barrier layer, thereby preventing erosion of the underlying barrier layer. Accordingly, the present invention enables the effective and efficient use of Cu or Cu alloy metalization in forming reliable interconnection patterns employing damascene technology in manufacturing submicron devices, e.g., semiconductor devices having a design rule of about $0.18\mu$ and under. As employed throughout this application, the symbol Cu is intended to encompass high purity elemental copper as well as Cu-based alloys, such as Cu alloys containing minor amounts of tin, zinc, magnesium, maganese, titanium and germanium.

Embodiments of the present invention achieve the objective of effective CMP of Cu metalization to achieve a specular surface having an RMS of no greater than 10 Å without scratching the surface of the Cu metalization and with high selectively to an underlying barrier layer by employing a novel slurry. Embodiments of the present invention comprise CMP Cu metalization employing a slurry containing $Al_2O_3$ and oxalic acid. As Cu and Cu alloys are relatively soft, they are typically scratched during CMP employing conventional slurries with a relatively high concentration of alumina. In accordance with the present invention, such scratching is avoided by employing a slurry containing a reduced amount of $Al_2O_3$ and by employing oxalic acid. The CMP slurries for Cu metalization, employed in the present invention provide a very low static etch rate for Cu and Cu alloys, e.g., less than 5 Å/minute, while achieving a high polishing removal rate, e.g. up to about 10,000 Å/minute. Moreover, slurries employed in the present invention exhibits a very high selectivity with respect to barrier layer material, such as Ta and TaN, e.g. up to about 500, thereby advantageously enabling CMP of Cu metalization to completely stop at the upper surface of the barrier layer. A subsequent separate barrier polishing step is then conducted, thereby optimizing planarity and metal line thickness variation vis-à-vis commercial slurries.

Given the disclosed objectives and guidance of the present disclosure, the optimum concentrations as well as adjuvants of the CMP slurry employed in the present invention can be optimized in a particular situation. For example, it was found that Cu metalization can be effectively planarized to a RMS of no greater than about 10 Å without scratching and with high selectively with respect to an underlying Ta or TaN barrier layer employing a slurry comprising about 0.1 to about 3 wt. % $Al_2O_3$ and about 0.2 to about 2 wt. % oxalic acid. It was found advantageous to include adjuvants such as an inhibitor to prevent Cu corrosion, e.g. a conventional inhibitor such as benzotriazole (BTA) at a concentration of about 0.05 to about 0.4 wt. %, about 3 to about 20 vol. % of 30% hydrogen peroxide ($H_2O_2$), e.g. about 5 to about 10 vol. % of 30% $H_2O_2$. Particular advantageous results have been achieved by employing about 0.2 to about 0.7 wt. % $Al_2O_3$ and about 0.3 to about 2 wt. % oxalic acid. The particular CMP parameters can also be optimized in a particular situation. For example, it was found suitable to apply a pressure of about 1 to about 4 PSI while rotating the polishing pad at about 30 to about 150 RPM.

Embodiments of the present invention comprise preparing slurries by sequentially mixing the $Al_2O_3$ with oxalic acid, adding the corrosion inhibitor, mixing, adding $H_2O_2$ and water, mixing, and finally adding water and mixing. In addition, a sufactant and suspension agent can be added to improve colloidal stability and modify the interaction between particles and the wafer surface to reduce defects. The slurry can be formulated employing the following classes of surfactants: (1) polyethers, such as polyethylene glycol, (2) aliphatic polyethers; (3) alkyl sulfates; and (4) alkylphenols. Everflo White (sodium free) sold by Universal Photonics. Inc. located in Hicksville, N.Y., can be employed as a suspension agent.

EXAMPLE

A 10 liter slurry was prepared by mixing 300 ml of XCTT3671 marketed by Rodel located in Newark, Del., which contained about 20 wt. % of dispersed submicron $Al_2O_3$, with 1 liter of 5 wt. % oxalic acid and 1 liter of 1% BTA. The mixture was stirred for about 10 minutes and 1 liter of 30 wt. % $H_2O_2$, was added with distilled water to form 10 liters of the slurry. Upon CMP of a Cu metalization at a 2 psi and a table speed of 150 rpm and the Cu removal rate was about 6,000 Å/min with no Cu etching. It was found that in a Cu area having a density of about 80%, the erosion of the underlying barrier layer was about 200 Å, while dishing for a $10\mu$ Cu line was about 400 Å.

Slurries in accordance with the present invention do not substantially etch Cu while achieving an extremely high polish removal rate with high selectivity to an underlying barrier layer, such as Ta or TaN. The present invention is particularly applicable to damascene techniques as illustrated in FIGS. 1–3, wherein similar features bear similar reference numerals.

Adverting to FIG. 1. a single damascene trench opening 11 and a dual damascene opening comprising a via hole 12A and trench 12B communicating with via hole 12A are formed in dielectric layer 10. Via hole 12A communicates with underlying conductive feature 13. A barrier metal layer 14 is deposited, as by sputtering or CVD, lining trench 11 and the dual damascene opening 12A, 12B, and on the upper surface of dielectric layer 10.

Figure 2:
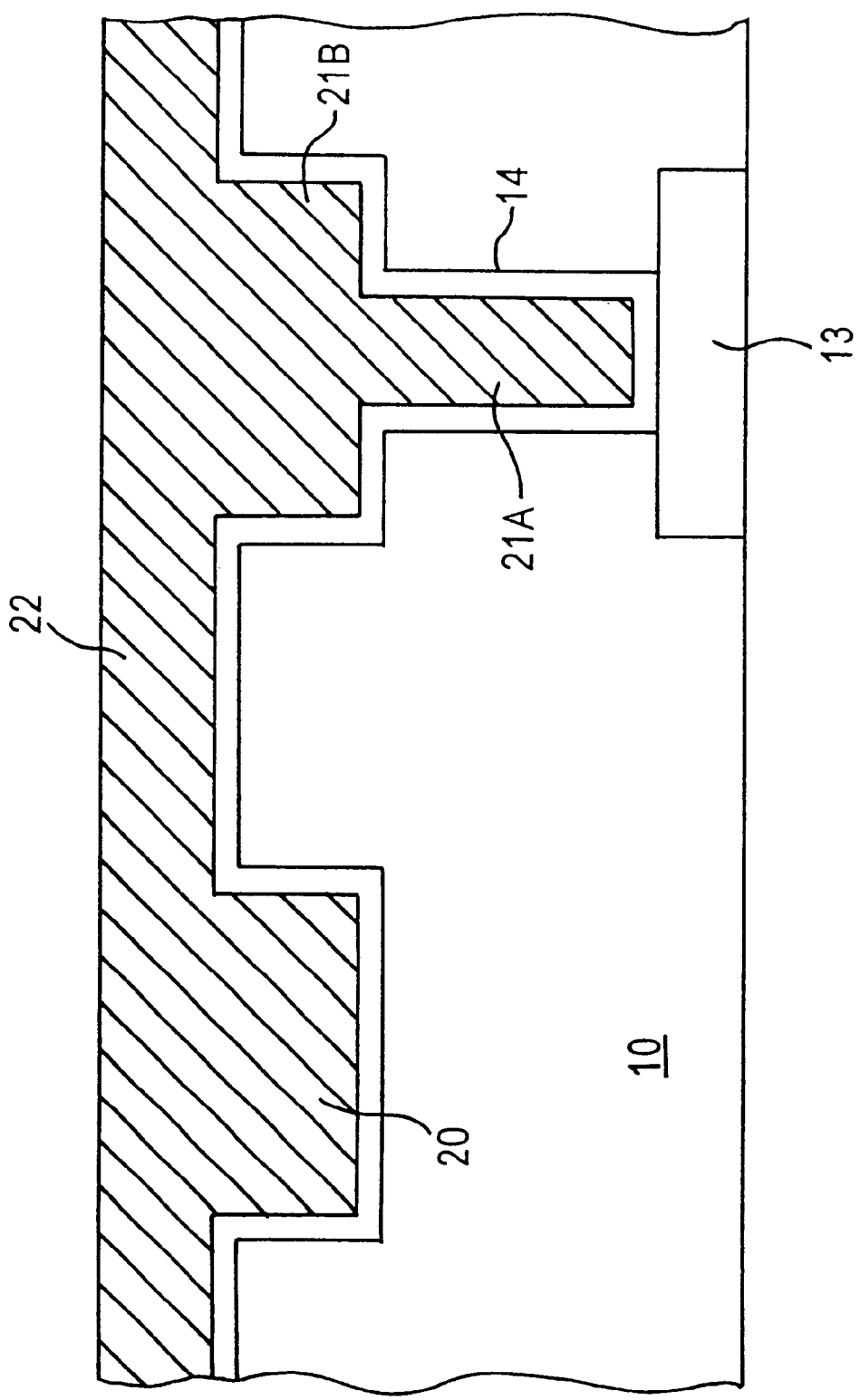

Adverting to FIG. 2, Cu or Cu alloy is deposited to fill trench opening 11 and dual damascene opening 12A, 12B. The Cu metalization filling a trench 11 is designated by reference numeral 20, Cu metalization filling via hole 12A is designated by reference numeral 21A and Cu metalization filling trench 12B is designated by reference numeral 21B. An upper layer of Cu metalization 22 is also formed on dielectric layer 10. The Cu metalization can be deposited in any conventional manner, as by PVD, CVD, electroplating or electroless plating. In depositing Cu metalization by electroless plating or electroplating, a conventional seed-layer (not shown for illustrative convenience) is deposited on barrier layer 14.

Figure 3:
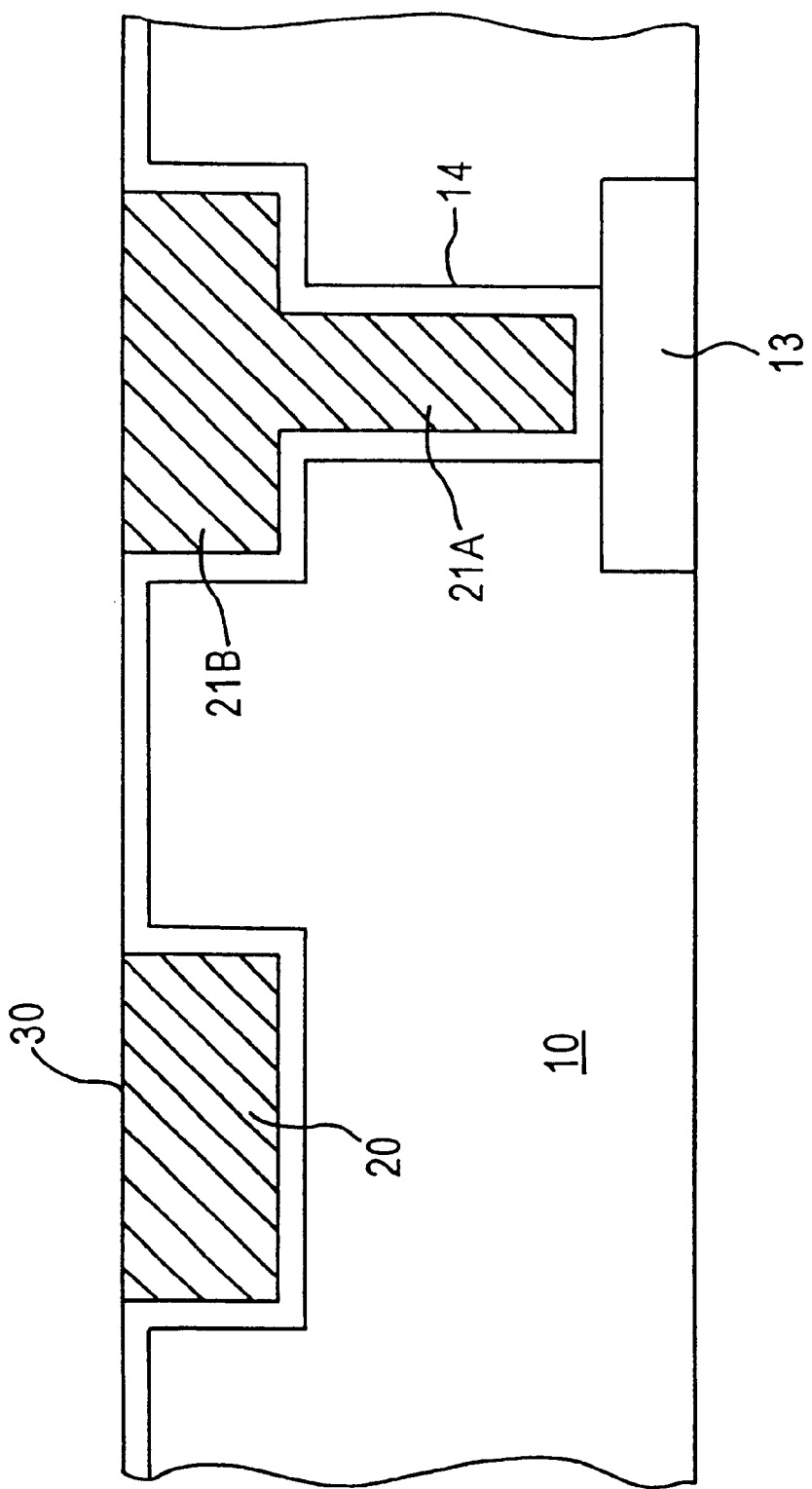

After Cu metalization, CMP is performed employing a slurry in accordance with the present invention which exhibits extremely high selectively with respect to underlying barrier layer 14, thereby enabling stopping when barrier layer 14 is reached as shown in FIG. 3 to form a substantially planar surface 30.

The present invention provides cost effective, efficient CMP methodology employing a slurry comprising a reduced amount of $Al_2O_3$ vis-à-vis conventional slurries, together with oxalic acid, to achieve a substantially planar surface having a RMS no greater than about 10 Å while exhibiting extremely high selectivity to an underlying barrier layer, such as Ta or TaN. The present invention can be employed in manufacturing any of various types of semiconductor devices, particularly semiconductor devices having a design rule of about 0.18 and under.

In the previous description, numerous specific details are set forth, such as specific materials, structures, chemicals, processes, etc., in order to provide a better understanding of the present invention. However, the present invention can be practiced without resorting to the details specifically set forth. In other instances, well known processing structures have not been described in order to unnecessarily obscure the present invention.

Only the preferred embodiment of the present invention and but a few examples of its versatility are shown and described in the present invention. It is to be understood that the present invention is capable of use in various other combination and environments and is capable of changes and modifications within the scope of the inventive concept as expressed herein.

What is claimed is:

1. A slurry for chemical mechanical polishing (CMP) copper (Cu) or a Cu alloy having higher selectivity to an underlying barrier layer, the slurry containing alumina ($Al_2O_3$) and oxalic acid.

2. The slurry according to claim 1, containing:
   about 0.2 to about 0.7 wt. % $Al_2O_3$; and
   about 0.2 to about 2 wet. % oxalic acid.

3. The slurry according to claim 2, containing:
   about 0.005 to about 0.4 wt. % benzotriazole;
   about 3 to about 20 vol. % of 30% hydrogen peroxide ($H_2O_2$); and water.

4. The slurry according to claim 3, containing:
   about 0.3 to about 1 wt. % oxalic acid; and
   about 5 to about 10 vol. % of 30% $H_2O_2$).

5. The slurry according to claim 4, further comprising a surfactant and/or a suspension agent.

6. A method of manufacturing a semiconductor device, the method comprising:
   chemical mechanical polishing (CMP) copper (Cu) or a Cu alloy with a slurry containing:
      about 0.2 to about 0.7 wt. % alumina ($Al_2O_3$); and
      about 0.3 to about 1 wt. % oxalic acid.

7. A method of preparing a slurry for chemical mechanical polishing copper (Cu) or a Cu alloy having high selectivity to an underlying barrier layer, the method comprising sequentially:
   mixing alumina ($Al_2O_3$) and oxalic acid;
   adding a corrosion inhibitor;
   mixing;
   adding $H_2O_2$ and water;
   mixing;
   adding water; and
   mixing.

8. The method according to claim 7, comprising;
   mixing about 0.1 to about 3 wt. % $Al_2O_3$ with about 0.2 to about 2 wt. % oxalic acid;
   adding about 0.05 to about 0.4 wt. % benzotriazole as the inhibitor;
   adding about 3 to about 20 wet. % of 30 vol. % $H_2O_2$ and water.

9. The method according to claim 8, comprising:
   mixing about 0.2 to about 0.7 wt. % $Al_2O_3$ with about 0.3 to about 1 wt. % oxalic acid; and
   adding about 5 to about 10 wt % of 30 wt % $H_2O_2$.

10. The method according to claim 8, further comprising introducing a surfactant prior to introducing the $H_2O_2$.

11. The method according to claim 6, comprising CMP with a slurry containing:
   about 0.5 to about 0.4 wt. % benzotriazole;
   about 3 to about 20 vol. % of 30% hydrogen peroxide ($H_2O_2$); and water.

* * * * *

UNITED STATES PATENT AND TRADEMARK OFFICE
CERTIFICATE OF CORRECTION

PATENT NO. : 6,332,989 B1
DATED : December 25, 2001
INVENTOR(S) : Kai Yang et al.

It is certified that error appears in the above-identified patent and that said Letters Patent is hereby corrected as shown below:

Column 5,
Line 51, replace "higher" with -- high --

Column 6,
Line 3, replace "wet." with -- wt. --
Line 11, after "$H_2O_2$" delete ")"
Lines 14-19, replace "A method of manufacturing a semiconductor device, the method comprising;
chemical mechanical polishing (CMP) copper (Cu) or a Cu alloy with a slurry containing:
about 0.2 to about 0.7 wt. % alumina ($Al_2O_3$); and about 0.3 to about 1 wt. % oxalic acid."
with -- The composition according to claim 1, wherein the barrier layer comprises tantalum or tantalum nitride. --
Line 37, insert -- and -- after "inhibitor";
Line 38, replace "wet." with -- wt. --
Lines 46-50, replace "The method according to claim 6, comprising CMP with a slurry containing:
about 0.5 to about 0.4 wt. % benzotriazole;
about 3 to about 20 vol. % of 30% hydrogen peroxide ($H_2O_2$); and water." with
-- The method according to claim 7, wherein the barrier layer comprises tantalum or tantalum nitride. --

Signed and Sealed this

Eighth Day of October, 2002

Attest:

JAMES E. ROGAN
Attesting Officer
Director of the United States Patent and Trademark Office